United States Patent [19]

Brown

[11] 4,393,316

[45] Jul. 12, 1983

[54] TRANSISTOR DRIVE CIRCUIT

[75] Inventor: Harold J. Brown, Lorain, Ohio

[73] Assignee: Reliance Electric Co., Cleveland, Ohio

[21] Appl. No.: 242,603

[22] Filed: Mar. 11, 1981

[51] Int. Cl.³ .......................... H03K 3/45; H03K 3/33
[52] U.S. Cl. .................................. 307/270; 307/280; 307/300; 307/314
[58] Field of Search ............... 307/270, 280, 300, 314

[56] References Cited

U.S. PATENT DOCUMENTS

| | | | |
|---|---|---|---|
| 3,986,052 | 10/1976 | Hanter | 307/300 |
| 4,123,670 | 10/1978 | Pollmeier | 307/300 |
| 4,200,813 | 4/1980 | Van Schaik et al. | 307/300 |
| 4,201,928 | 5/1980 | Koetsch | 307/300 |
| 4,227,099 | 10/1980 | Houkes | 307/300 |
| 4,248,598 | 9/1982 | Smith | 307/208 |

OTHER PUBLICATIONS

"Base Circuit Design for High-Voltage Switching Transistor in Power Converters"—W. Hetterscheid—Power Conversion International-vol. 6, No. 5, Sep.-/Oct., 1980, pp. 39 to 46.

Primary Examiner—Stanley D. Miller
Assistant Examiner—B. P. Davis
Attorney, Agent, or Firm—Michael M. Rickin

[57] ABSTRACT

A drive current circuit for a switching power transistor which allows the controlled turn off of the transistor without affecting transistor turn on. The drive transformer has two cores one of which follows a linear magnetization characteristic and the other of which has a relatively high permeability. The input and output windings of the drive transformer are wound on both cores. A turn off winding is also included which is wound only on the high permeability core. A source of turn off charge is directly coupled to the transistor. Shorting of the turn off winding initiates the controlled turn off of the transistor.

16 Claims, 5 Drawing Figures

TRANSISTOR DRIVE CIRCUIT

BACKGROUND OF THE INVENTION

1. Field of the Invention

This invention relates to the transistor(s) used in electrical power switching circuits and, more particularly to a drive circuit which allows for a controlled turn off of the power transistor without effecting transistor turn on.

2. Description of the Prior Art

In many applications such as power conversion circuits, it is necessary to operate transistors as power switches to interrupt substantial current flows. In the presence of such large current flows, a transistor tends to accumulate a charge in the vicinity of the base region which charge interferes with the rapid turn off of the transistor switch. Turn off of the transistor will be delayed until such time as the charge stored in the transistor's base region is substantially removed. This period of time is known as the storage time.

There have been a number of techniques proposed in the prior art for removing the stored charge during turn off of the transistor. Common to many of these techniques is the attempt to try to remove the stored charge from the base region as quickly as possible. It has now been found that if the charge is pulled out of the base region too quickly the collector current will be caused to flow in a narrow path or channel. In effect an attempt to rapidly remove the charge from the transistor's base region in order to expedite transistor turn off results in the transistor's collector current flowing through a narrower collector-emitter junction than the collector current would ordinarily flow through. Thus the attempts to expedite charge removal from the base region place a strain on the transistor which may result in failure of the device.

The attempt to expedite charge removal from the base region also results in unneeded power loss in the transistor during turn off. Fast removal of the charge from the base region causes the collector current to fall towards zero with a tail or fillet which may extend for an appreciable period of time. Simultaneously therewith as the transistor is driven out of saturation towards cutoff the collector to emitter voltage rises substantially. The combination of the increasing collector to emitter voltage and the slowly decaying tail on the collector current results in power losses. These losses in turn may cause excessive heating of the transistor thereby resulting in device failure.

It was therefore recognized that rapid removal of the base charge may not be the way to expedite turn off of the transistor. In an article entitled "Base Circuit Design for High-Voltage Switching Transistors Power Converters" by W. Hetterscheid and published in the September/October 1980 edition of Power Conversion International pages 39 to 46 the turn off as well as the turn on behavior of high voltage power transistors used in switched mode power supplies is discussed. In this article various techniques for turning off such transistors are discussed. The article indicates that an improvement in turn off behavior can be obtained by slowing down rather than speeding up removal of charge from the transistor's base region. In particular in FIG. 4C thereof a turn off circuit using an inductor in series with the transistor base is shown. It is further stated that the fall times and the time for base charge removal are increased when the temperature of the junction is increased.

The article then describes an optimum base drive circuit which is shown in FIG. 10A thereof. This circuit while continuing to use the inductor in series with the switching transistor's base also includes resistive and capacitive elements which are said to be needed in order to obtain optimum turn on of the transistor. It is also suggested that a resistor be connected between the transistor's base and emitter to eliminate parasitic oscillations (ringing). Thus while the prior art has come to recognize that an inductor may give superior results in helping to remove stored charge from the base of the transistor it has been believed necessary to compensate for the effects of the inductor during transistor turn on.

It was then recognized that it would be far more desirable to remove stored charge from the base region of a transistor in a manner so as to avoid the power losses associated with the prior art techniques and also to avoid the introduction of unnecessary circuitry during turn on of the transistor. It was further recognized that it would be desirable to provide this removal of stored charge from the transistor's base region in a manner such that the variation in transistor operating characteristics which often occurs in transistors of the identical type would have no effect on the operation of the circuit in which the transistor is used. It was further recognized that removal of stored charge from the transistor's base region during turn off should be provided in a manner such that power losses are minimized and in a manner which is substantially insensitive to the operating temperature of the transistor.

In accordance with the present invention a controlled turn off of a transistor operating in its saturated conducting mode is obtained by the use of a source of constant voltage which is directly coupled to the base of the transistor. The drive transformer associated with the transistor uses a two core arrangement, consisting of linear and non-linear cores wherein turn off is initiated by shorting the non-linear core. The linear core then supports the voltage to give a slowly decreasing base current which linearly changes with time. Turn off of the transistor is accomplished without the harmful effects associated with prior art turn off techniques. The circuit of the present invention also allows turn on of the transistor to be accomplished without the necessity of introducing additional circuit elements.

SUMMARY OF THE INVENTION

In accordance with the present invention there is disclosed a circuit for providing drive current to a transistor which operates in the saturated mode when conducting. The circuit allows for a controlled turn off of the transistor without affecting transistor turn on. Included in the circuit is a source of turn off charge which is directly coupled to the transistor. The voltage of the source is constant at least during transistor turn off. Also included is a drive transformer which has two cores one of which has a linear magnetization characteristic and the other of which is saturable and has a relatively high permeability. The transformer has an input winding which receives the drive current and an output winding connected to the source and the transistor. A turn off winding is also included in the transformer. The input and output windings are wound on both cores whereas the turn off winding is would only on the high permeability core. Connected to the turn off winding is a circuit which responds to a predetermined signal to short the high permeability core thereby initiating transistor turn off.

DESCRIPTION OF THE PREFERRED EMBODIMENT

Figure 1:
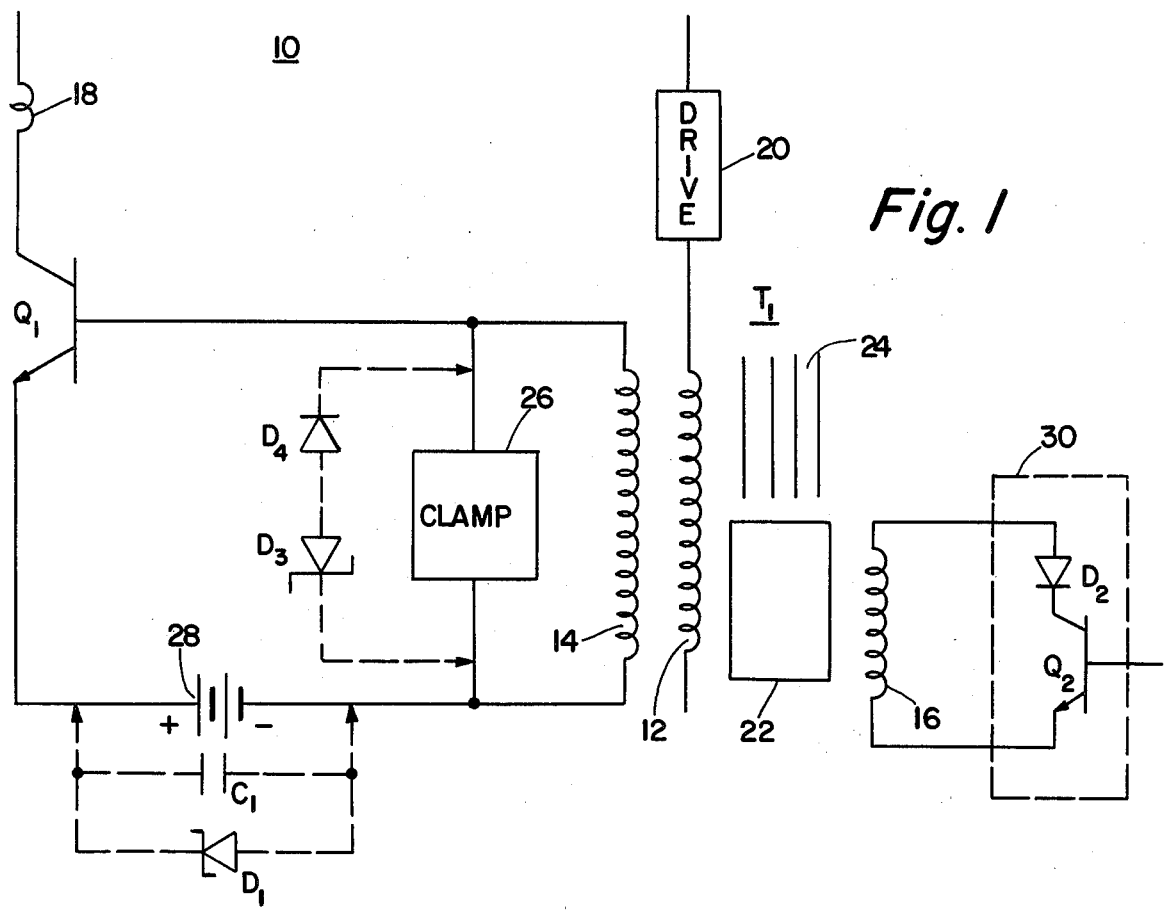
FIG. 1 is a block-schematic diagram of a power circuit wherein a transistor alternately switches between the saturated conducting mode and nonconducting mode of operation.

Referring to FIG. 1 there is shown the block-schematic diagram of the power switching circuit portion 10 of a circuit for supplying power which utilizes the present invention. Power circuit 10 includes transistor Q1 which alternately switches between the saturated conducting mode of operation and the nonconducting mode of operation either alone or in combination with other similarly operated transistors to provide, in a manner well known in the art, power to a load. For example, Q1 may be one transistor of the half bridge configuration shown in FIG. 3 to be described hereinafter.

Circuit 10 comprises in addition to transistor Q1 a transformer T1 having a base drive input winding 12, a base drive output winding 14 and in accordance with the present invention a turn off control winding 16. Transformer T1 may also include a proportional drive or regenerative winding 18 which aids in turn on of Q1 and in addition reinforces the turn off of the transistor. Transformer T1 also includes cores 22 and 24. Transformer core 22 upon which all of the windings of T1 are wound is comprised of a high permeability material such as permalloy tape which follows a square loop magnetization characteristic. Transformer core 24 upon which only windings 12, 14 and 18 of T1 are wound provides an inductor which has a substantially constant and low value of inductance. In order to provide such an inductance, core 24 may be comprised for example of a material such as powdered permalloy which follows a linear magnetization characteristic. Thus winding 16 of transformer T1 is wound only on core 22 whereas windings 12, 14 and 18 are wound on both cores 22 and 24.

Figure 3:
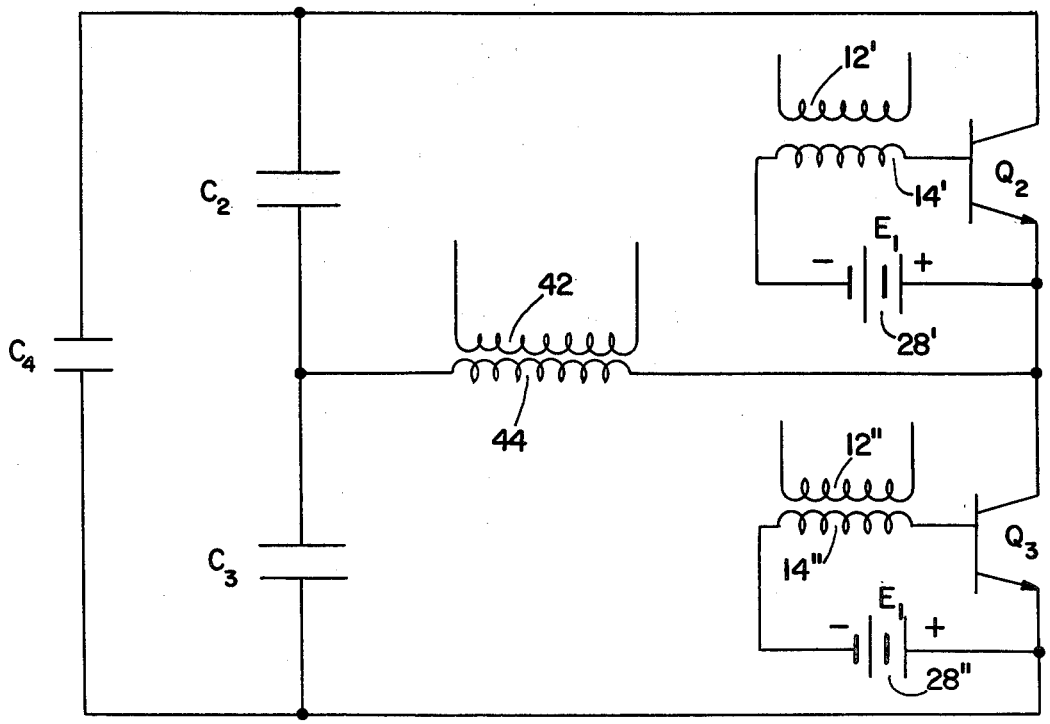
FIG. 3 is a half bridge inverter circuit using the present invention.
Figure 4:
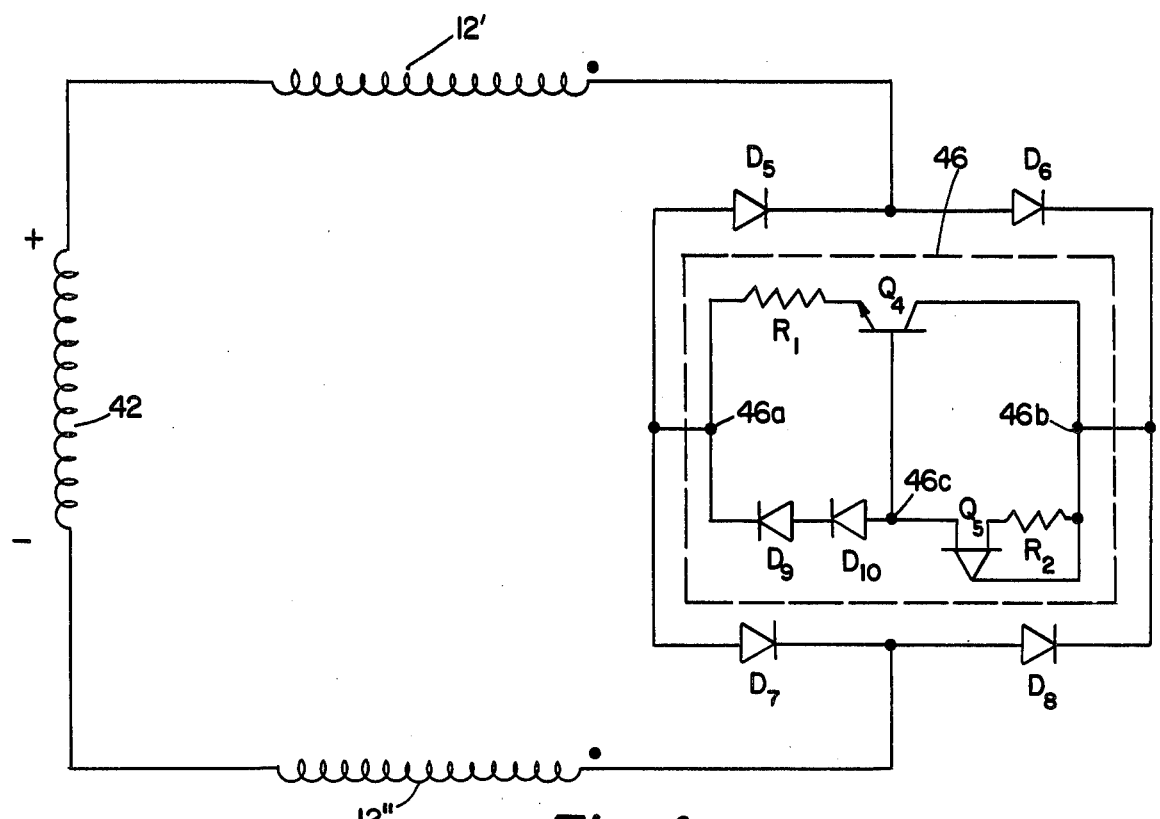
FIG. 4 is a source of drive current for the circuit of FIG. 3.

Connected in series with winding 12 is circuit 20 which provides a periodic current signal of alternating polarity to drive transistor Q1 and provide the excitation for drive transformer T1. An embodiment for drive current circuit 20 for use in the half bridge configuration of FIG. 3 is shown in FIG. 4 to be described hereinafter. When the current signal changes in polarity in one direction the turn on of transistor Q1 is initiated. When the current signal changes in polarity in the other direction upon the turn off of Q1 core 22 is reset. Connected across winding 16 is circuit 30 which is used to short core 22 to thereby initiate the controlled turn off of transistor Q1. The operation of circuits 20 and 30 will be described in more detail hereinafter. Thus circuit 10 also includes a circuit for turning on transistor Q1 and another circuit for initiating a controlled turn off of the transistor in accordance with the present invention.

Circuit 10 further includes reverse voltage source 28 which provides as will be described hereinafter a source of direct coupled charge and therefore the voltage to allow a controlled turn off of transistor Q1. Source 28 as shown in FIG. 1 is a battery having a potential of E1 with its positive terminal connected to the emitter of Q1 and its negative terminal connected to one end of winding 14. The other end of winding 14 is connected to the base of Q1. Source 28 may be implemented as shown by the dotted lines of FIG. 1 as the parallel combination of capacitor C1 and zener diode D1. Diode D1 has its cathode connected to the emitter of Q1 and its anode connected to the same end of winding 14 to which the negative terminal of the battery is connected. Diode D1 allows the capacitor to be charged to a predetermined voltage. Charge is maintained on capacitor C1 at all times and any loss in charge is replenished by the forward base current resulting when transistor Q1 conducts. Source 28 provides during turn off of transistor Q1 a direct coupled source of constant voltage which allows the base current of the transistor to decrease linearly with time. In this manner the charges accumulated on the base region of Q1 during conduction are uniformly removed to provide a controlled turn off of the transistor.

Connected across winding 14 is clamping circuit 26 which is used to provide a voltage E2 which acts to limit the reverse voltage across the base-emitter junction of Q1 at the time when the transistor first turns off. Circuit 26 may for example be comprised of the series combination of zener diode D3 and diode D4 shown by the dotted lines in FIG. 1.

Figure 2:
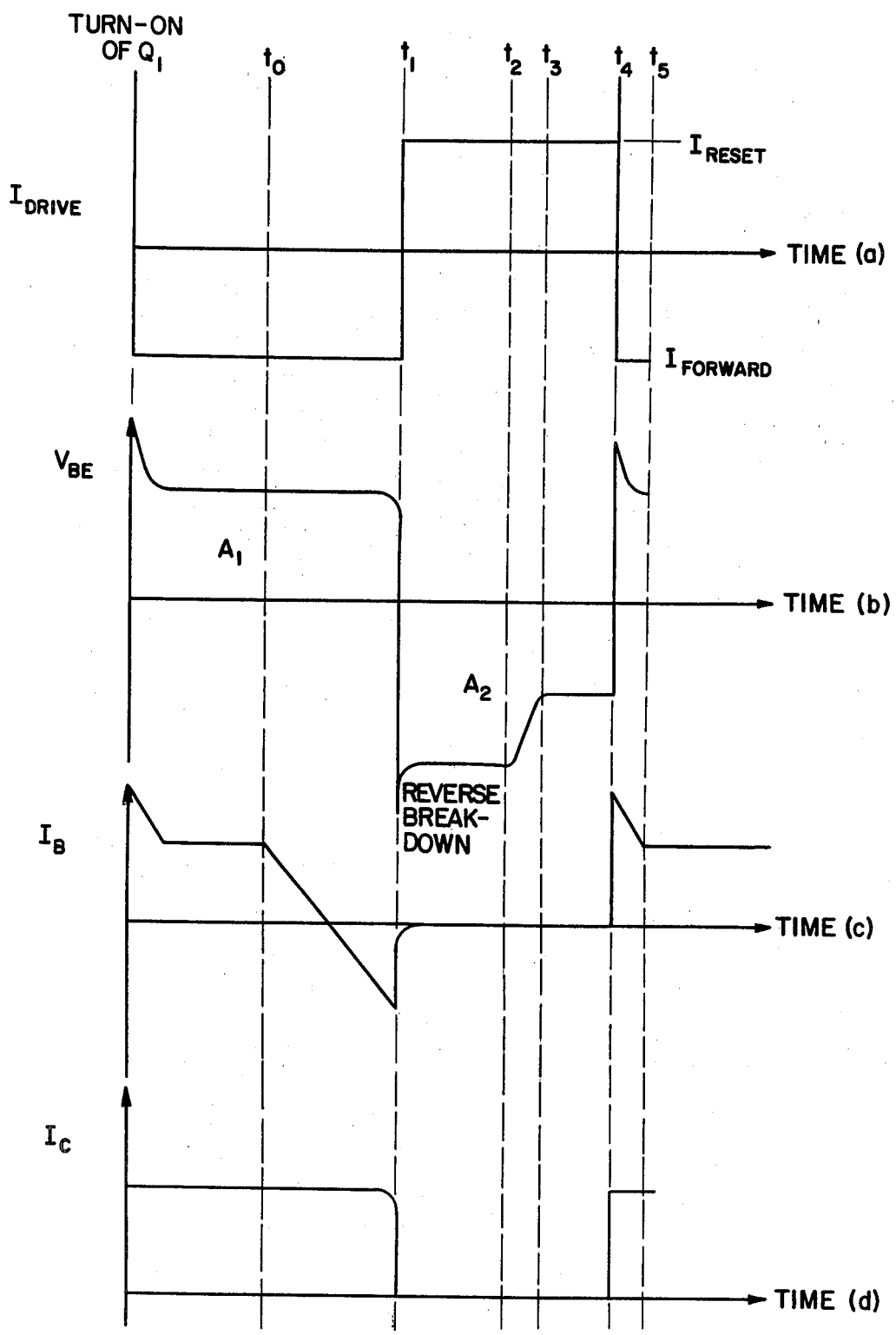
FIGS. 2(a) to 2(d) are waveforms of various voltages and currents associated with FIG. 1.

The operation of circuit 10 will now be described in detail in connection with the various waveforms shown in FIGS. 2A to 2D. For ease of description it will be assumed that transistor Q1 is conducting. As transistor Q1 is being used for the purposes of power conversion the transistor is operating as a switch and is therefore in saturation when conducting. Thus the transistor's collector voltage is at its saturation value and the base to emitter voltage is in the order of 0.8 volts. The collector current is at a value which is determined by the transistor's operating characteristics and the load connected thereto and the base current is at the value to maintain the transistor in saturation for the load connected thereto. Typical waveforms for the drive current, the base to emitter voltage and the base and collector currents are shown in FIG. 2 wherein the drive current is shown in FIG. 2(a), the base emitter voltage is shown in 2(b), the base current is shown in 2(c), and the collector current is shown in 2(d). For purposes of illustration it has been assumed that the drive current has a negative polarity when Q1 is conducting.

At the instant of time identified in FIG. 2 as $t_0$, a signal appears at circuit 30 to drive the circuit into conduction thereby shorting winding 16 and initiating turn off of transistor Q1. The signal may be generated by logic circuitry (not shown) included in the power supply. Circuit 30 may for example be the series combination of the transistor Q2 and diode D2 shown by the dotted lines in FIG. 1. While turn off is initiated at time $t_0$ the transistor Q1 does not actually turn off until such time as desaturation of the base-emitter junction occurs. This desaturation happens at the time identified as $t_1$ in FIG. 2. The turn off initiation signal received by circuit 30 starts at time $t_0$ and has a duration greater than the time interval $(t_1-t_0)$ needed to turn off transistor Q1.

Just prior to time $t_0$, Q1 was conducting and the voltage $E_F$, across winding 14 may be expressed as:

$$E_F = E_1 + E_B \quad (1)$$

where $E_1$ is the voltage of source 28 and $E_B$ is the base to emitter voltage of Q1. As all of the windings of transformer T1 are wound on core 22 the shorting of winding 16 at time $t_0$ acts as a clamp with respect to core 22. The voltage $E_R$ must therefore be supported by core 24.

Until the transistor Q1 actually turns off at time $t_1$ its base to emitter voltage remains as shown in FIG. 2(b) essentially constant. There is prior to actual turn off a slight decrease in the base to emitter voltage the amount of which depends on the type of transistor used for Q1. The voltage $E_1$ across capacitor C1 is constant and is typically in the order to from three to five times the saturated value of Q1's base to emitter voltage. Therefore any slight variation in transistor base to emitter voltage during the turn off process has substantially no effect on the voltage appearing across winding 14. Thus the voltage $E_F$ across winding 14 remains substantially constant during the turn off process.

As linear core material 24 represents an inductor having a constant inductance L, and as the voltage $E_F$ across winding 14 is essentially constant there is therefore developed by the well known relationship, $E = L \, di/dt$, a current which changes linearly with time. The voltage in source 28 is of a polarity which causes this current to flow into the base of transistor Q1. This linearly changing transistor base current allows removal of the excess charges stored in the transistor's base-emitter junction and therefore starting at time $t_0$ the base current decreases with time.

As shown in FIG. 2 following the initiation of turn off at time $t_0$ the base current of Q1 decreases linearly with time while the other voltages and currents shown in FIG. 2 remain essentially constant. The inductor represented by core 24 also insures that any slight variation in the transistor's base to emitter voltage will not have a substantial effect on the linear removal with time of the charge stored in the base region. The inductor opposes any instantaneous changes in the base current which would result from variations in the base to emitter voltage.

Actual turn off of the transistor at time $t_1$ occurs when sufficient charges have been removed from the base-emitter junction to allow that junction to open. During conduction and up until the time the junction actually opens, the voltage across the junction has a polarity of positive at the base and negative at the emitter. When the base-emitter junction of Q1 opens the voltage across the junction reverses in lolarity and increases in amplitude. At the instant that the reverse base-emitter voltage equals the voltage of source 28 the voltage across winding 14 goes to zero and the linearly changing current ceases. The base current which is now negative in amplitude cannot decrease further and as Q1 is no longer to support the current at this time the base current rapidly rises to zero in the manner to be described hereinafter. By selecting the source voltage and the value of inductance the time from the initiation of turn off to actual transistor turn off may be controlled as desired. Typically it is desired to have turn off occur within three microseconds of initiation.

Simultaneously with the rapid rise to zero of the base current at the time $t_1$, the collector current as shown in FIG. 2(d) quickly falls to zero without the tail or fillet normally associated with that current during transistor turn off. A tail indicates a slow turn off of the transistor at time $t_1$. The combination of rising collector voltage and a collector current with a tail represent unnecessary losses during transistor turn off. As the transistor rapidly turns off the collector voltage (not shown) also rapidly rises from the low saturated value it had when the transistor was on. Thus, the present invention allows collector current fall without a tail and thereby minimizes the power losses in the transistor during turn off.

Proportional drive winding 18 aids in the fall of the collector current at time $t_1$. By transformer action the falling collector current in winding 18 should cause through winding 14 a fall in the base current of Q1. This fall in the base current should be in addition to the fall of current caused by the controlled remkval of charge from the base-emitter junction. As the junction has opened at time $t_1$ the base current is prevented from falling further. The falling collector current therefore causes an increment of voltage in the transistor's base-emitter junction which in turn causes the base-emitter voltage to rapidly reach the transistor's reverse breakdown voltage. The rapid fall of the base-emitter voltage at time $t_1$ to the reverse breakdown voltage in turn allows the collector current to fall to zero in a minimum amount of time. Winding 18 therefore aids in promoting a rapid turn off of Q1 at time $t_1$.

The action of the base current at time $t_1$ will now be described in detail. As described above when the base-emitter junction of Q1 opens at time $t_1$ the voltage across the junction reverses in polarity and increases in amplitude. The linear change in the base current ceases when the junction voltage equals the voltage of source 28. There is still, however, base current flowing in circuit 10. As the junction is open, Q1 is no longer able to support the base current at this time. The current should therefore change instantaneously. Any such instantaneous change in the current is opposed by the linear inductor of core 24. The current flows therefore in the loop comprising clamping circuit 26 and winding 14 resulting in the turning on of circuit 26.

Circuit 26 is selected to provide a voltage $E_2$ across winding 14 whose magnitude is greater than the magnitude of $E_F$. This voltage which is essentially constant is opposite in polarity to $E_F$ and therefore develops in combination with linear core 24 (core 22 is still shorted at this time) a current which changes linearly in time in a direction opposite to the linearly changing current developed by the voltage $E_F$. As the magnitude of $E_2$ is greater than the magnitude of $E_F$, the rate of change of the current developed by $E_2$ is greater than the rate of change of the current developed by $E_F$. Therefore, the base current rapidly rises to zero as shown in FIG. 2(c). The time for the base current to rise to zero (commonly referred to as the fall time) is quite short as compared to the time between $t_0$ and $t_1$ and in general the circuit of the present invention allows the rise in base current to occur with a fall time that is substantially shorter than the fall time typically specified for the type of transistor used for Q1.

The action of the base-emitter voltage at time $t_1$ will now be described in detail. When the base-emitter junction of Q1 opens at time $t_1$ the voltage across the junction reverses in polarity and increases in amplitude. The reverse base to emitter voltage will increase in amplitude to momentarily reach the reverse breakdown voltage of the junction. Were it not for the action of clamping circuit 26, the reverse base-emitter voltage would not only momentarily reach the reverse breakdown voltage but would remain at that value until such time as core 22 resets. As soon as circuit 26 conducts the reverse voltage across the base to emitter junction obtains a magnitude equal to the sum of the voltage of circuit 26 ($E_2$) and the voltage of source 28 ($E_1$). Thus, upon turning off of Q1 at time $t_1$ the voltage across the base to emitter junction of Q1 reverses in polarity and as a result of the action of clamping circuit 26 attains a magnitude equal to the sum of the magnitudes of $E_1$ and $E_2$.

The voltage of clamping circuit 26 appears across winding 14. When the base current is no longer changing linearly with time, the linear core 24 is unable to suppport the voltage of circuit 26. This voltage therefore appears across and is supported by core 22.

The turning off of circuit 30 will now be described. The logic signal to circuit 30 which initiated turn off of transistor Q1 has a duration longer than the turn off time interval ($t_1$-$t_0$). Circuit 30 does, however, cease conduction upon the actual turn off of Q1. High permeability core 22 acts as a current transformer. As the current in the base of Q1 decreases linearly with time the current flowing in circuit 30 increases linearly with time. When the base current of Q1 rises to zero the current flowing in circuit 30 falls to zero. Diode D2 of circuit 30, poled as shown, does not permit the current in circuit 30 to reverse direction. When the voltage of clamp circuit 26 appears across core 22, transistor Q2 of circuit 30 is turned off and the short across winding 16 is therefore removed at time $t_1$.

The reversal in the base of emitter junction voltage of transistor $Q_1$ at time $t_1$ provides, as will be described in connection with FIGS. 3 and 4, a signal to the circuitry which generates the drive current. In response to this reversal in junction voltage the source generating the drive current reverses the polarity of that current at time $t_1$ as shown in FIG. 2($a$). Core 22 is comprised of material which follows a square loop magnetization characteristicc. The reversal of the drive current at time $t_1$ causes the current in winding 12 to flow in a direction so as to cause core 22 to be magnetized in the reset direction. The reset direction of magnetization which the core assumes when Q1 is off is opposite to the magnetization which core 22 assumes when Q1 is conducting. This reverse drive current is more than sufficient to cause core 22 to reset. The excess drive current therefore flows by transformer action through clamping circuit 26.

When core 22 magnetizes at the time designated as $t_2$ in FIG. 2 it can no longer support the voltage of circuit 26. The voltage of circuit 26 is then supported by core 24 which gives rise to a rate of change of current in circuit 26 which is opposite in direction to the flow of current in circuit 26 when core 22 supported the voltage of the circuit. At the time identified in FIG. 2 as $t_3$ the current in circuit 26 therefore goes to zero and the clamp voltage also goes to zero.

When the clamp voltage goes to zero the voltage across the base-emitter junction of Q1 decreases in magnitude and rises in the reverse direction to reach the voltage of source 28 at time $t_3$. While not shown in FIG. 2($b$) there are some parasitic oscillations (ringing) associated with the rise in base-emitter voltage at time $t_3$. This ringing arises as a result of the interaction of the capacity of the base-emitter junction and core 24 upon the turn off of clamping circuit 26. When circuit 26 turns off, core 24 provides in combination with the capacity of the junction a resonant circuit which allows for the discharge of the charge stored in the junction capacity. The discharge appears as a ringing signal on the base-emitter voltage at time $t_3$. Source 28 acts as a buffer to thereby prevent the ringing signal from turning on transistor Q1 at this time. Circuit 10 is therefore ready for the next reversal in polarity of the drive current at the time designated as $t_4$ in FIG. 2 which reversal will cause the turn on of Q1.

Before describing in detail the turn on of Q1 at time $t_4$, the further beneficial effects of clamping circuit 26 will be described. When the base to emitter voltage of Q1 reversed at time $t_1$ this voltage increased to and would remain at the reverse breakdown voltage were it not for the action of circuit 26. At time $t_1$ circuit 26 also provides a path for the rapid rise to zero of the transistor base current. In the absence of circuit 26 the rapidly rising transistor base current would flow instead through the transistor's base-emitter junction which is at the reverse breakdown voltage. This flow of base current would be in a direction so as to cause the discharge of source 28. While any charge lost by source 28 during this interval would be replaced when the transistor next conducts, it is desirable that no such discharging of source 28 occur. If source 28 were sufficiently discharged by the flow of base current, its buffering action as described previously would be diminished. If the source were completely discharged by the reverse base current flow, the ringing signal appearing at the base-emitter junction at time $t_3$ may result in the undesired and premature turn on of Q1 at that time. Thus, clamping circuit 26 prevents the base-emitter voltage of Q1 from remaining at its reverse breakdown value at time $t_1$ and also provides a path for the rapidly rising base current to thereby avoid any discharging of source 28.

As described previously, clamping circuit 26 must provide a voltage $E_2$ which is greater in magnitude than $E_F$. More particularly, the voltage $E_2$ must be selected such that the area under the waveform of base to emitter voltage during the time Q1 is conducting must be equal to the area under the waveform from the time when the transistor actually turns off to the time the clamping circuit turns off. More specifically with reference to FIG. 2($b$) the voltage $E_2$ must be selected such that the area A1 under the base to emitter voltage versus time characteristic shown therein from the time designated as "turn on of Q1" to $t_1$ must be equal to the area, A2, under the characteristic from time $t_1$ to time $t_3$.

It should be appreciated that even in the absence of clamping circuit 26 the present invention would provide a controlled turn off of transistor Q1. The principal differences in operation of circuit 10 in the absence of the clamping circuit are enumerated below. At time $t_1$ the base-emitter voltage of $Q_1$ would go to and remain at the reverse breakdown voltage of the transistor until core 22 resets at time $t_2$. Any ringing in the base-emitter voltage at time $t_3$ would appear across the base-emitter junction of Q1 thereby preventing the possibility of turning Q1 on at that time. In addition, source 28 may be discharged either in whole or in part during the flow of the rapidly rising base current at time $t_1$ thereby diminishing the buffering action of the source at time $t_3$. Even in the absence of clamping circuit 26 the various voltage parameters of circuit 10 would have to be selected such that the area A1 is equal to the area A2. Thus, clamping circuit 26 provides certain beneficial results in the operation of the present invention during transistor turn off.

Turn on of transistor Q1 occurs at time $t_4$ upon the reversal of polarity of the current drive signal in winding 12. At time $t_2$ core 22 is reset. Up until turn on at $t_4$, the reset drive current provided a sustaining current to transformer T1 to keep core 22 reset and core 24 magnetized. When the drive current reverses in polarity at time $t_4$ from reset to forward, turn on of Q1 is initiated. More specifically, when the drive current reverses at that time the energy in core 24 cannot change instantaneously. The only path for the change in drive current is through winding 14 which is assumed to have the same number of turns as winding 12. The base current in the transistor therefore increases instantaneously from zero by an amount equal to the sum of currents designated in FIG. 2(a) as I FORWARD and I RESET. Where the drive current is a symmetrical waveform such that the forward current is equal to the reset current, the instantaneous change of transistor base current may be said to be equal to twice the forward or reverse current.

The instantaneous change in current across winding 14 at time $t_4$ results in the charging of the base capacity of Q1. When the capacity is charged the transistor turns on and the base-emitter voltage rises as shown in FIG. 2(b) to a value which is above the voltage ($E_B$) ordinarily appearing across the junction when the transistor is conducting. Simultaneously therewith a voltage equal to the sum of the base-emitter voltage and the voltage of source 28 appears across winding 14. As core 22 is reset this voltage is supported by linear core 24 and a linearly decreasing current flows in the base of transistor Q1. When at the time designated as $t_5$ in FIG. 2 the base current linearly decreases sufficiently to be equal in magnitude to the drive current, the linear change in base current ceases at that time. Core 24 is no longer able to support the voltage across winding 14. This voltage is then supported by core 22 which changes its magnetization state from reset to set.

As shown in FIGS. 2(b) and 2(c) during the interval of time from turn on of transistor Q1 at time $t_4$ and the setting of core 22 at time $t_5$, both the base-emitter voltage and the base current decrease from the values they assumed upon turn on of Q1. At time $t_5$ the base-emitter voltage is at its saturation value, typically 0.8 volts and the base current has a value dependent on the load served by Q1, the amplitude of the drive current and the magnetization current of core 22. The forward drive current is sufficient in amplitude to provide both for the magnetization current of core 22 and a forward base current for Q1 which may allow the transistor to supply a light load. Depending on load requirements the forward base current of Q1 may have to be larger in amplitude than that which is available from the drive current. This additional drive current is supplied by the proportional drive winding 18 as a result of the transformer action between that winding and winding 14. Loads heavier than that which can be supplied by the base current available from the forward drive current require increased collector current. Increased collector current causes by the transformer action between windings 14 and 18 the increased base current needed to allow Q1 to meet the power requirements of the load. In a typical circuit constructed in accordance with the present invention winding 18 had one turn and winding 14 had ten turns.

Referring to FIG. 3 there is shown half bridge inverter circuit 40 wherein the present invention may advantageously be used to effect a controlled turn off of transistors which alternately switch between the saturated conducting mode of operation and the nonconducting mode of operation. The alternating output of the inverter appears across the transformer winding designated as 44. Each of the transistors Q2 and Q3 included in circuit 40 operate in a manner identical to transistor Q1 of circuit 10. When transistor Q2 is conducting in its saturated mode, transistor Q3 is nonconducting and when transistor Q3 is conducting in its saturated mode transistor Q2 is nonconducting. Each of the transistors include a base drive input winding designated as 12' and 12" for Q2 and Q3, respectively, and a base drive output winding designated as 14' and 14" for Q2 and Q3, respectively. Windings 12' and 14' and windings 12" and 14" correspond and function identically to windings 12 and 14 of FIG. 1.

Each of transistors Q2 and Q3 also include a direct coupled source of turn off charge designated as 28' and 28" for Q2 and Q3, respectively. Sources 28' and 28" function and may be embodied in a manner identical to source 28 shown in FIG. 1. Although not shown in FIG. 3 each of transistors Q2 and Q3 would also include a turn off control winding identical to winding 16 of FIG. 1 with its associated turn off control circuit 30. Finally, each of transistors Q2 and Q3 would also include cores 22 and 24 with the base drive input and output windings and the turn off control windings being wound on the cores in the manner described previously for circuit 10. Transistors Q2 and Q3 may also have associated in the collectors thereof a winding identical to proportional drive winding 18 of FIG. 1 and a clamping circuit across windings 14' and 14" identical to circuit 26 of FIG. 1 to provide the beneficial results described previously. For ease of illustration in FIG. 3 the two core arrangement, the turn off winding and associated turn off control circuit and the clamping circuit and proportional drive winding have been omitted from FIG. 3. Thus, each of transistors Q2 and Q3 would include circuitry according to the present invention and identical to that shown in FIG. 3 for providing a controlled turn off of the transistor operating in the saturated conducting mode.

As is well known in the art with transistor Q2 conducting and transistor Q3 nonconducting a voltage having a first polarity appears across output winding 44. When transistor Q2 turns off and transistor Q3 conducts the polarity of the voltage across winding 44 reverses. As described previously for FIG. 1 and as shown in FIG. 2, the reversal of the base-emitter voltage across transistor Q1 at the turning off thereof at time $t_1$ signals a reversal of the drive current in winding 12. In circuit 40 the reversal of the base-emitter voltage of each of transistors Q2 and Q3 upon its turn off gives rise to the reversal of polarity in inverter output voltage, discussed above, across winding 44. Circuit 40 also includes winding 42 which is in transformer relationship with winding 44. Windings 42 and 44 are wound on a separate core from the cores in which windings 12', 14' and 12", 14" are wound. Winding 42 detects this reversal in polarity and thereby signals the reversal in drive current. Winding 42 is not directly detecting the reversal in transistor base-emitter voltage but the effect the reversal of that voltage has on the output of the inverter. A circuit for generating drive current is shown in FIG. 4 to be described hereinafter.

The reversal of drive current will first be described in general and then with respect to FIG. 4. Assume transistor Q2 is conducting in its saturated mode of operation and transistor Q3 is nonconducting. A forward drive current is flowing in the input drive winding 12' of Q2 and a reset drive current is flowing in the input drive winding 12" of Q3. Upon the controlled turn off of Q2 in the manner described previously for transistor Q1 at FIG. 1, the base-emitter voltage of Q2 reverses in polarity. The output voltage of inverter 40 across winding 44 therefore reverses in polarity. This reversal is sensed by winding 42 and the drive current for Q2 reverses from a forward current to a reset current. Simultaneously therewith the drive current for Q3 reverses from a reset current to a forward current initiating turn on of Q3 in the manner described previously for transistor Q1 of FIG. 1. Upon the controlled turn off of transistor Q3 in the manner described previously for Q1, the reversal of Q3's base-emitter voltage causes reversal in polarity of the inverter output voltage across winding 44. This reversal is sensed by winding 42 to thereby cause a reversal in drive current to both transistors Q2 and Q3. Transistor Q2 which is off when Q3 is conducting is driven into conduction by the reversal of the drive current. Thus, for the half bridge inverter shown in FIG. 3 the controlled turning off of the saturated conducting mode transistor signals a reversal in drive current to thereby initiate a turn on of the then off transistor.

Referring to FIG. 4 there is shown the source 46 which provides drive current for inverter 40. Source 46 provides an unidirectional constant current which flows through base drive input windings 12' and 12" and winding 42 in a direction determined by the polarity of voltage across winding 42. Diodes D5, D6, D7 and D8 are connected in a bridge configuration between the dotted ends of windings 12' and 12". The diodes conduct in pairs in response to the polarity of the voltage across winding 42 to provide for reversal in the direction of drive flow through windings 12' and 12". The cathode of diode D5 and the anode of diode D6 are connected to each other and the dotted end of winding 12'. The cathode of diode D7 and the anode of diode D8 are connected to each other and the dotted end of winding 12". The anodes of diodes D5 and D7 are connected to each other and the terminal designated as 46a of source 46. The cathodes of diodes D6 and D8 are connected to each other and the terminal designated as 46b of source 46. Thus, source 46 provides an unidirectional constant current and is the center leg of the bridge formed by diodes D5, D6, D7 and D8.

Source 46 includes series connected diodes D9 and D10 with the cathode of D9 being connected to terminal 46a and the anode of D10 being connected to the junction 46c wherein the base of a transistor Q4 and the source of an N-channel field effect transistor Q5 (FET) are also connected. The gate of FET Q5 is connected to its drain by resistor R2 and to terminal 46b wherein also the collector of transistor Q4 is connected. The emitter of Q4 is connected by resistor R1 to terminal 46a and therefore to the cathode of D9.

The operation of source 46 will now be described. FET Q5 acts as a current source to provide independent of voltage a constant current for transistor Q4 and diodes D9 and D10. The diodes D9 and D10 in response to the constant current from FET Q5 generate a reference voltage which in turn specifies a constant current through resistor R1. Transistor Q4 adjusts its conduction with changes in load on source 46 to thereby maintain the current across R1 constant. Thus, source 46 provides at terminal 46a a current which is constant and independent of the voltage across winding 42.

The manner in which the constant current generated by source 46 reverses in polarity in input windings 12' and 12" upon the turn off of the on transistor will now be described. Assume that transistor Q2 (FIG. 3) is conducting and a voltage appears across winding 42 with the polarity shown in FIG. 4. The constant current generated by source 46 will flow through diode D7 which is forward biased by the voltage of winding 42 and through winding 12" entering at the dotted end and exiting at the nondotted end thereof. This same current will also flow through winding 12" entering at the nondotted end and exiting at the dotted end thereof. The current returns to terminal 46b of source 46 by flowing through forward biased diode D6. As the current of source 46 flows in opposite directions through windings 12' and 12" with respect to the dotted ends thereof opposite polarity drive currents appear in the bases of transistors Q2 and Q3.

Assume further that in accordance with the present invention a controlled turn off of transistor Q2 is initiated. When the transistor actually turns off the voltage across winding 42 reverses in polarity from that shown in FIG. 4. Diodes D6 and D7 which were previously conducting are now nonconducting and diodes D5 and D8 which were previously nonconducting now conduct to allow the constant current generated by source 46 to flow through windings 12' and 12" opposite to the direction of flow described previously. The drive current in windings 14' and 14" of transistors Q2 and Q3 therefore reverses in polarity to thereby initiate the turn on of transistor Q3 and the resetting of the high permeability core associated with transistor Q2. Thus upon the controlled turn off of the then conducting transistor, the constant current of source 46 reverses direction of flow through the drive windings of each transistor to thereby initiate a turn on of the then nonconducting transistor.

Figure 5:
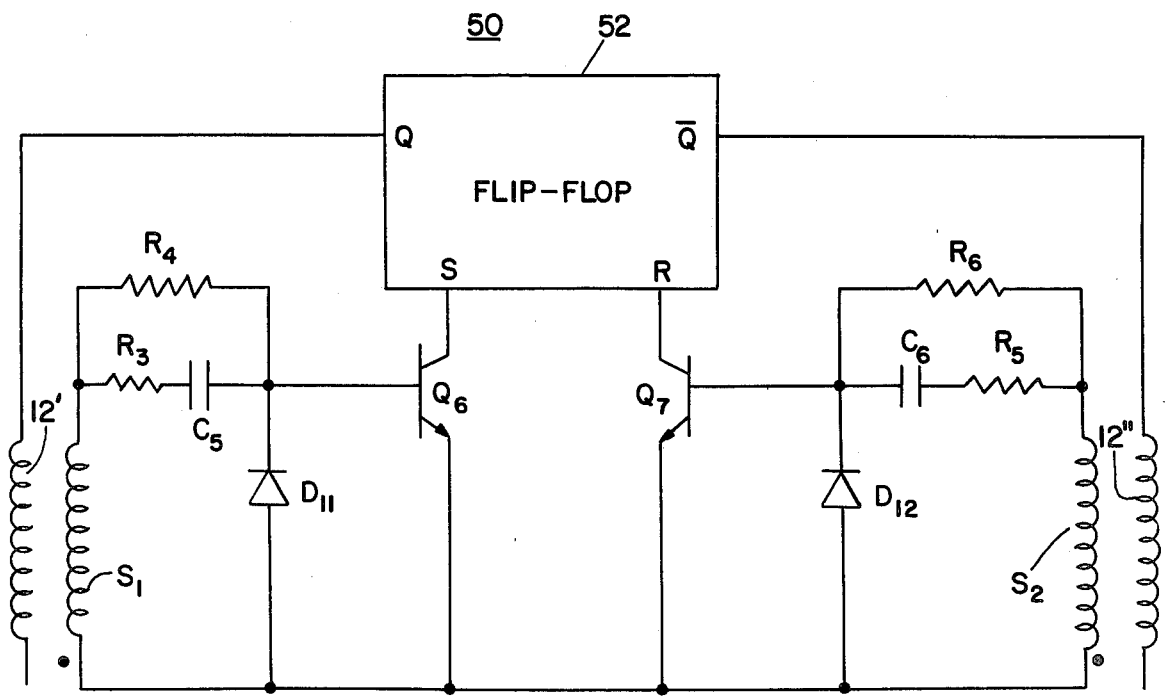
FIG. 5 is an embodiment for an alternative drive current source.

Referring to FIG. 5 there is shown an embodiment of an alternative circuit 50 which may be used to provide drive current for the half bridge inverter shown in FIG. 3. This alternative circuit senses the reversal of base-emitter voltage of the transistor being turned off in FIG. 3 to thereby provide the reversal in drive current. The reversal of base-emitter voltage of transistors Q2 and Q3 is sensed by having a first sensing winding, designated in FIG. 5 as $S_1$, in transformer relationship with Q2 input drive winding 12' and a second sensing winding, designated as $S_2$, in transformer relationship with Q3 input drive winding 12". The drive current is provided by connecting the input drive windings 12' and 12" each to a respective one of the outputs of a flip-flop 52. The flip-flop is of the type having set and reset inputs and the sense winding $S_1$ is connected to one of the inputs through a transistor Q6 and the sense winding $S_2$ is connected to the other of the inputs through a transistor Q7. For convenience of illustration transistors Q6 and Q7 have been shown connected to the S (set) and R (reset) inputs of flip-flop 52 and windings 12' and 12" have been shown connected to the Q and $\bar{Q}$ outputs, respectively, of flip-flop 52. Upon the reversal of the base-emitter voltage of the transistor Q2 or Q3 in FIG. 3 being turned off, the corresponding sense winding $S_1$ or $S_2$ in combination with its associated transistor Q6 or Q7 provides a signal to the set or reset input of the flip-flop, as the case may be, to thereby cause a reversal in the drive current.

These are some differences between the drive current circuit shown in FIG. 5 and the drive current circuit shown in FIG. 4 described previously. The circuit of FIG. 4 senses the change in collector voltage of the power transistors of FIG. 3 to thereby provide a reversal of drive current. This change in collector voltage was sensed by providing a winding 42 connected in transformer relationship to the output winding 44 of the half bridge inverter. Circuit 50 senses reversals in the base-emitter voltage of the turning off transistor by the use of sense windings $S_1$ and $S_2$. Therefore when the drive current source of circuit 50 is used, there is no need for winding 42. The circuit of FIG. 5 is used in those circumstances where the collector circuit of the power transistors is not voltage responsive to changes in transistor collector current. Such a circumstance may arise, for example, where the power transistors are supplying light load and therefore have relatively little collector current to work with.

The operation of the circuit of FIG. 5 will now be described. Assume that Q2 (FIG. 3) is conducting. Sense winding $S_1$ is connected to a differentiator circuit comprising the combination of resistors $R_3$ and $R_4$ and capacitor C5 connected as shown in FIG. 5. This differentiator circuit is connected between one end of winding $S_1$ and the junction of diode D11 and the base of transistor Q6. When transistor Q2 is conducting a voltage appears across winding $S_1$ such that a current flows through diode D11 to thereby charge capacitor C5. Sense winding $S_2$ is connected by an identically arranged diode, D12, and differentiator circuit ($R_5$, $R_6$, C6) to the base of its associated transistor Q7.

When transistor Q2 turns off the voltage across winding 12′ and therefore the voltage across winding $S_1$ reverses in polarity thereby reverse biasing diode D11. The capacitor charging current is thereafter turned off and a spike of appropriate polarity appears on the base of Q6 turning the transistor on. The collector of Q6 is connected to the set input of the flip-flop 52. The turning on of transistor Q6 generates a signal to that input to thereby cause the flip-flop to change its state. As input drive windings 12′ and 12″ are connected to the output of flip-flop 52 a reversal in the drive current for both Q2 and Q3 therefore results. Transistor Q3 turns on and capacitor C6 is now charged through its associated diode. Transistor Q7 is turned off and remains off until the turn off of transistor Q3. When Q3 turns off a signal is generated by Q7 which is connected to the reset input of flip-flop 52 to cause the flip-flop to change its state. This change in state causes a reversal in the drive current to transistors Q2 and Q3. Thus, circuit 50 by sensing the reversal in base-emitter when the one of transistors Q2 and Q3 which is conducting turns off provides a reversal in drive current to the power transistors resulting in a turning on of the then off transistor and a resetting of the square loop core associated with the transistor which has just undergone turn off.

It should be appreciated that the drive current is reversed only at such time as the power transistor (Q1 or Q2 or Q3) has become desaturated. When the transistor desaturates the voltage across the transistor's base-emitter junction reaches its maximum negative value. With the high permeability core 22 the drive transformer acts by virtue of the energy stored in the linear core as a current transformer. The presence of proportional drive winding 18 aids the reversal in base-emitter voltage and insures that the collector current will fall at the maximum possible rate thereby putting the minimum stress on the transistor.

It should further be appreciated that the present invention provides the controlled turn off without affecting turn on by the combination of the dual core transformer and the direct coupled source of turn off charge. Should premature turn on of the transistor due to ringing be of concern, clamping circuit 26 may be included without the necessity of adding damping elements such as resistors which affect the rate of change of base voltage.

What is claimed is:

1. A bipolar transistor drive and control circuit comprising:
    (a) a DC charge means directly coupled to said transistor for providing a source of charge for turn off of said transistor;
    (b) a transformer having both a high permeability magnetic core and a low permeability linear magnetic core said transformer also having input and output drive current means said input drive means receiving a drive current signal and said output drive means being connected to both said charge means and said transistor; and
    (c) turn off control winding means acting only on said high permeability core.

2. The circuit of claim 1 wherein said DC charge means includes charge storage means.

3. The circuit of claim 1 including means connected to said turn off control winding means for shorting said winding means at a predetermined time.

4. The circuit of claim 1 wherein a clamping circuit means is connected across said output drive current means.

5. The circuit of claim 4 wherein said DC charge means includes charge storage means.

6. The circuit of claim 5 wherein said DC charge means further includes a voltage reference means in parallel with said charge storage means.

7. The circuit of claim 6 wherein said charge storage means is a capacitor and said voltage reference means is a zener diode.

8. The circuit of claim 1 wherein said transformer further includes regenerative current means connected to said transistor.

9. A drive and control circuit for a bipolar transistor comprising:
    (a) means directly coupled to said transistor for providing a source of charge for turn off of said transistor said means having a substantially constant voltage at least during said turn off; and
    (b) a drive transformer having both a low permeability linear magnetic core, and a high permeability magnetic core said transformer including:
        (i) an input winding for receiving a drive current of alternating polarity;
        (ii) an output winding connected between said source and said transistor; and
        (iii) a turn off winding wound only on said high permeability core.

10. The circuit of claim 9 wherein said charge source means includes means for storing said charge.

11. The circuit of claim 9 including means connected to said turn off winding for shorting said winding at a predetermined time.

12. The circuit of claim 9 wherein a clamping circuit means is connected across said output winding.

13. The circuit of claim 12 wherein said charge source means includes means for storing said charge.

14. The circuit of claim 13 wherein said charge source means further includes a voltage reference means in parallel with said charge storage means.

15. The circuit of claim 9 wherein said transformer further includes a proportional drive winding.

16. A drive and control circuit for a bipolar transistor having a base, an emitter and a collector, said circuit comprising:

(a) a reverse DC charge means having positive and negative terminals said positive terminal being directly connected to said emitter; and
(b) a transformer having both a high permeability magnetic core and a low permeability linear magnetic core said transformer including:
 (i) input means for receiving a drive current of alternating polarity;
 (ii) output means connected between said base and said charge means negative terminal; and
 (iii) turn off control winding means associated with said high permeability core.

* * * * *